United States Patent [19]

Sarin et al.

[11] Patent Number: 5,763,008
[45] Date of Patent: Jun. 9, 1998

[54] CHEMICAL VAPOR DEPOSITION OF MULLITE COATINGS

[75] Inventors: Vinod Sarin, Lexington; Rao Mulpuri, Boston, both of Mass.

[73] Assignee: Trustees of Boston University, Boston, Mass.

[21] Appl. No.: 368,814

[22] Filed: Jan. 6, 1995

[51] Int. Cl.$^6$ .................................................. C23C 16/00
[52] U.S. Cl. ............................. 427/255.3; 427/255.2; 427/255.1; 427/255; 427/252; 427/253; 427/314
[58] Field of Search .................... 427/255.2, 255.3, 427/255.1, 252, 253, 255, 314

[56] References Cited

U.S. PATENT DOCUMENTS

| | | | |
|---|---|---|---|
| 3,306,768 | 2/1967 | Peterson. | |
| 4,673,587 | 6/1987 | Kamigaito et al. | |
| 4,761,323 | 8/1988 | Mühlratzer et al. | |
| 4,880,614 | 11/1989 | Strangman et al. | 428/623 |
| 5,015,502 | 5/1991 | Strangman et al. | 427/248.1 |
| 5,077,243 | 12/1991 | Nakano et al. | 501/95 |
| 5,091,009 | 2/1992 | Nogami et al. | 106/287.1 |
| 5,231,061 | 7/1993 | Devore | 501/95 |
| 5,294,387 | 3/1994 | Nakano et al. | 264/60 |
| 5,316,797 | 5/1994 | Hazlebeck et al. | 421/376.2 |
| 5,320,909 | 6/1994 | Scharman et al. | 428/472 |
| 5,322,711 | 6/1994 | Gabor et al. | 427/249 |
| 5,336,453 | 8/1994 | Giller et al. | 264/57 |

FOREIGN PATENT DOCUMENTS

| | | |
|---|---|---|
| 4228711 | 3/1994 | Germany. |
| 62-238368 | 10/1987 | Japan. |

OTHER PUBLICATIONS

M.S.J. Gani, et al. "Glass formation and phase transformations in plasma prepared $Al_2O_3SiO_2$ powders", Journal of Materials Science, May 1977, vol. 12, No. 5, pp. 999–1009.

S.K. Tung, et al. "The Deposition and Physical Properties of Aluminosilicate Films", Journal of the electrochemical Society, Jan. 1970, vol. 117, No. 1, pp. 91–95.

Sacks et al. "A Review of Powder Preparation Methods and Densification Procedures For Fabricating High Density Mullite" in Ceramic Transactions: Mullite and Mullite Matrix Composites, vol. 6, pp. 167–207, editors S. Somiya et al; Published by the American Ceramic Society, 1990 (from the Proceedings of the International Conference on Mullite held in Tokyo, Japan, Nov. 1987).

Lewis. "Technique for Producing Mullite and other Mixed–Oxide Systems", J. Am. Ceram. Soc. 74(10), 1991, pp. 2410–2413.

Aksay et al. "Mullite for Structural, Electronic and Optical Applications", J. Am. Ceram. Soc. 74(10) 1991, pp. 2343–2358.

Okada et al, "Review of Mullite Synthesis Routes in Japan", Ceramic Bulletin vol. 70, No. 10, 1991, pp. 1633–1640.

Pierson. "Handbook of Chemical Vapor Deposition (CVD), Principles Technology and Applications", Noyes Publications, 1992, pp. 227, 228 and 249.

Primary Examiner—Roy V. King
Attorney, Agent, or Firm—Baker & Botts, L.L.P.

[57] ABSTRACT

This invention is directed to the creation of crystalline mullite coatings having uniform microstructure by chemical vapor deposition (CVD). The process comprises the steps of establishing a flow of reactants which will yield mullite in a CVD reactor, and depositing a crystalline coating from the reactant flow. The process will yield crystalline coatings which are dense and of uniform thickness.

15 Claims, 7 Drawing Sheets

CHEMICAL VAPOR DEPOSITION OF MULLITE COATINGS

This invention was made with U.S. Government support under DOE contract number DE-AC-05-84OR21400. The U.S. Government has certain rights in this invention.

BACKGROUND

1. Field of the Invention

This invention relates to methods for producing mullite coatings and mullite powders by chemical vapor deposition (CVD) and to the resulting coated substrates. Specifically, the coatings produced by this method are dense and both the powder and the coatings produced by the method have a uniform thickness and a uniform microstructure.

2. Description of the Background

As is known in the art, heat engines are more efficient and produce more power at higher nominal operating temperatures. Unfortunately, however, the temperature at which the engines may operate is limited by the ability of the engine components to withstand the heat, oxidation and corrosion effects of the impinging hot gas stream. Mechanical strength of the operating components is diminished over time in such an environment.

In recent years, interest has grown in the potential use of ceramics in heat engines as a means of achieving higher operating temperatures and increased efficiency based upon decreased fuel consumption. $Si_3N_4$ and SiC currently appear to be the leading candidate materials due to their unique combination of high strength and thermal conductivity, low thermal expansion, and good high temperature stability. Ceramics possess excellent room and elevated temperature strength as well as thermal stability. However, $Si_3N_4$ and SiC have poor corrosion behavior in fuel environments, and are susceptible to damage due to contact stress thus limiting their full usage as engine materials.

Many engineering operations are conducted at high temperatures in an air or oxygen environment. Oxides unlike most of the carbides and nitrides are typically stable at high temperature in an oxygen and oxygen-nitrogen atmosphere. In case of $Si_3N_4$ and SiC, oxidation does not appear to be a problem due to the formation of a passive $SiO_2$ surface layer at moderate oxygen pressures. This thin, self-healing layer protects the Si-based substrates from catastrophic oxidation by effectively minimizing diffusion of $O_2$ to the substrate. However, corrosion can result from the combined effect of oxygen plus gaseous, condensed, or particulate impurities introduced via the impinging gas stream. These impurities can increase the rate of passive oxidation by modifying the transport rate of oxygen through the protective layer, by causing active oxidation via formation of SiO which accelerates the degradation process, or by producing compositions such as $Na_2SiO_3$ which chemically attack the ceramic via rapid corrosion. Small quantities of impurities have a pronounced effect on the corrosion behavior of $Si_3N_4$ and SiC. This effect is especially pronounced in applications where heavy residual fuels are being considered since these fuels often contain large amounts of impurities. Corrosion of SiC also occurs in the presence of $Na_2SO_4$. Corrosion may cause a strength degradation of as much as 30–45%.

In gas turbine engine testing at high temperatures, contact stresses often damage structural components made of ceramics such as $Si_3N_4$ and SiC. The surface damage is attributed to high localized tensile stresses due to biaxial loading at interfaces. These tensile stresses result from aerodynamic forces and relative motion at the interfaces due to thermal expansion. Tensile stresses are localized at the surface and decrease rapidly inward.

Since the eventual failure of ceramic components is mainly due to surface damage whether by contact stresses or by corrosion (or both), it is believed that this damage can be reduced via the application of a thin coating that can withstand higher amounts of contact stresses and corrosion effects than the underlying substrate. High temperature protective coatings have shown some promise but have generally failed to meet all the requirements of the applications. An effective coating must be adherent and chemically stable and it should possess good oxidation and corrosion resistance and thermal shock properties. Attempts to obtain these coating properties generally focus on the selection of material properties and selection of the coating process parameters. Desired material properties include low thermal conductivity, a relatively high coefficient of thermal expansion, and most importantly, chemical and mechanical stability in the gas turbine environment. Many state-of-the-art ceramic coating materials, such as the stabilized zirconias, exhibit inherent thermodynamic instability problems when subjected to combustion environments that contain impurities such as sodium, potassium, vanadium, phosphorous and sulfur. Reactions between the ceramic coating material and corrosive combustion gases or condensates may also cause failure of some coatings in the absence of porosity.

One common method of coating is the plasma spray process. The plasma spray process generally produces a porous coating which may help achieve increased thermal protection and improved thermal stress resistance. Unfortunately, however, such a porous coating may allow gas to permeate and condensed salt to penetrate the porous coating structure thereby inducing coating degradation. In general, further improvements of thermal barrier coatings are still required with respect to corrosion and thermal shock resistance.

Mullite has been found to possess the material properties necessary for use as a thermal barrier coating. Mullite is an excellent high temperature material with high corrosion resistance, high thermal shock resistance, chemical stability at high temperatures, and a coefficient of thermal expansion close to that of $Si_3N_4$ and SiC. It is the only stable crystalline compound in the $Al_2O_3$—$SiO_2$ system under normal atmospheric pressure. It has a chemical composition ranging from $3Al_2O_3.2SiO_2$ (71.8 wt % $Al_2O_3$) to approximately $2Al_2O_3.SiO_2$ (77.3 wt % $Al_2 O_3$) and crystallizes in the orthorhombic system. It has a melting point of 1850° C. and a coefficient of thermal expansion (CTE) of $5.62\times10^{-6}$/°C. in the 25°–1500° C. range. In the absence of glassy inclusions, mullite retains greater than 90% of its room temperature strength to 1500° C. and displays very high creep and thermal shock resistance.

Variation in solid solubility (70% to 82% $Al_2O_3$) has been found to be dependent on the method of synthesis. The solid solubility of $Al_2O_3$ in $SiO_2$ when formed by CVD is yet to be established. Mullite has been found as a good material not only for high temperature applications, but also for electronic and optical applications. Mullite has a fracture toughness of about 2.2 $MPa/m^{1/2}$ and strength of about 500 MPa, and when pure can retain this strength up to 1500° C. Intergranular fracture is observed in mullite at high temperatures (1700° C.) due to reduction of crack tip intensity in the plastic zone by energy dissipation through plastic relaxation occurring in the more viscous grain-boundary glassy phase, resulting in higher flexural strength.

Coatings containing mullite as a major phase have shown some promise in thermal cycle tests. Duplex coatings with a mullite inter-layer, and a high alumina content coating on the surface have been found to protect SiC from corrosion. High temperature atmospheric plasma sprayed mullite coatings have also shown some promise as corrosion resistant coatings. However, as noted above, the plasma spray process has inherent porosity problems. Additionally, the microstructure and thus the properties of the coating cannot be controlled accurately.

Another application for ceramics is the sintering of bulk parts from ceramic powders. The properties which make mullite desirable for use as a coating also suggest its use for powders to sinter bulk parts. In this environment, close control of the microstructure of the powder is necessary in order to produce parts with consistent properties. Close control of microstructure, grain size, and the aggregate particle size is important in the consolidation of bulk parts because it affects the properties of the final product. For example, grain growth and microporosity can have a profound effect on properties of $Al_2O_3$ components. Techniques presently used to produce powders have been incapable of achieving the necessary control of the microstructure and have thus been relatively unsuccessful in the formation of bulk parts via sintering.

A need therefore exists for a technique which can produce a dense mullite coating having good protective properties and a mullite powder having a controlled microstructure and capable of being sintered to form bulk parts.

SUMMARY OF THE INVENTION

It is therefore an object of the present invention to provide an improved method for depositing mullite coatings on substrates.

It is a further object of the present invention to provide an improved coated ceramic having increased resistance to oxidation, corrosion and contact stress.

It is a yet further object of the present invention to provide an improved process for synthesizing a mullite powder usable in producing bulk parts via sintering.

It is a still further object of the present invention to provide an apparatus for coating a ceramic by chemical vapor deposition according to the methods of this invention.

These objects are achieved through the present invention which provides a method and an apparatus for depositing mullite coatings on substrates using CVD. In this way, it is possible to grow dense, adherent, crystalline mullite coatings which provide excellent protective characteristics. Specifically, the coatings formed as a result of the present invention offer improved high temperature corrosion resistance and contact stress resistance. While this invention is particularly effective when employed to coat $Si_3N_4$ and SiC substrates, it has broad applicability beyond these particular materials. In addition, the apparatus of the current invention may be used, under different process conditions, to produce a fine mullite powder of approximately 100 nm size. This powder has wide application in high temperature environments and may be used to consolidate bulk parts via sintering.

BRIEF DESCRIPTION OF THE DRAWINGS

FIG. 4(a) and 4(b) are scanning electron micrographs of a mullite coating on a $Si_3N_4$ substrate deposited according to one embodiment of the method of this invention. FIG. 4(a) is a cross-sectional view and FIG. 4(b) is a surface view.

FIG. 6(a) illustrates an agglomerate of particles and FIG. 6(b) shows an individual particle.

DETAILED DESCRIPTION

Figure 1:
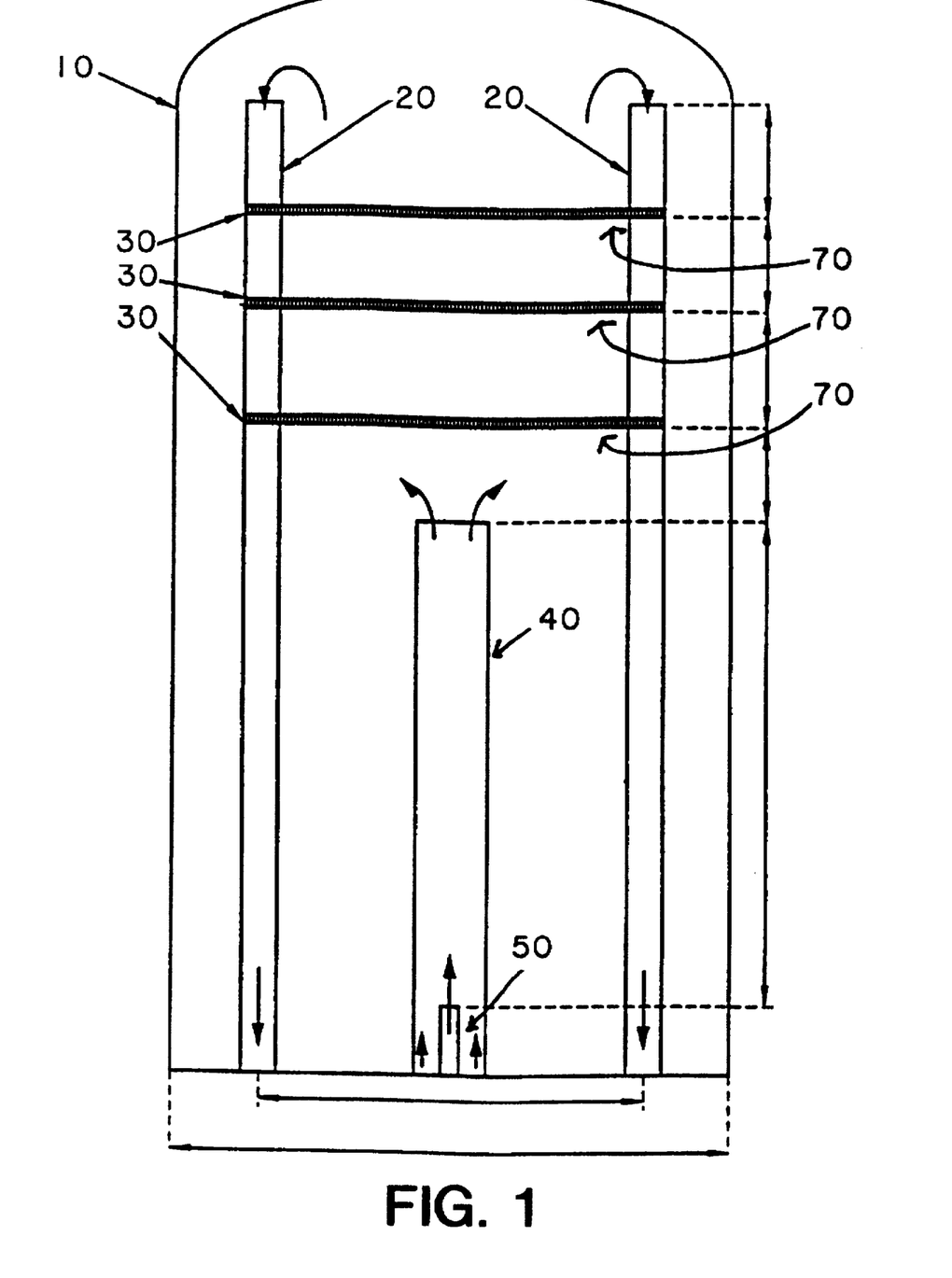
FIG. 1 is a schematic representation of a novel CVD reactor for accomplishing the method of the present invention.

FIG. 1 is an illustration of a novel CVD reactor for use with the novel methods for producing mullite powders and coatings according to the teachings of the present invention. The reactor 10 provides an enclosed area wherein mullite deposition or powder synthesis may take place. In a preferred embodiment of this invention the reactor chamber is 4.5 inches in diameter and has a height of about 25 inches. The reactor is preferably constructed from Inconel 600 alloy. A heating source (not shown) provides precise temperature control within the chamber environment. A vacuum pump (not shown) is also supplied in order to precisely control pressure within reactant chamber 10. Also provided (not shown) are sensors for monitoring pressure, gas flow rates and chamber temperature.

One or more reactant gases are introduced from the bottom of the chamber through tube 50. Similarly, additional reactants flow through sleeve 40 which is coaxial with tube 50. In a preferred embodiment, the distance from the outlet port of tube 50 to the far end of sleeve 40 is about 14 inches. Additionally, there are provided a plurality of sample holders 30 allowing for varying the position of the substrate with respect to the end of sleeve 40 and tube 50. In a preferred embodiment, sample holders are spaced at two inch increments. It is possible, however, to provide more or less sample holders 30 as well as varying the distance between them.

The distance between the outlet port of tube 50 (where the reactant gases enter the CVD reactor 10) and the substrate may be varied by placing the substrate in each of the substrate holders 30. Similarly the distance may be adjusted by substituting tubes of varying lengths for tube 50. Alternatively, the position of the outlet port of tube 50 may be adjusted by raising or lowering tube 50 within sleeve 40. The height of sleeve 40 may also be adjusted to provide precise gas flow control. Further provided are a pair of exhaust tubes 20 which allow the reactant gases and the gases produced through the reaction to escape from the reactor 10. In a preferred embodiment, there are two exhaust tubes 20 spaced approximately 3.75 inches apart although there may be additional exhaust tubes which may or may not be at different spacings. The exhaust tubes 20 preferably serve the additional purpose of providing support for the substrate through sample holders 30. The exhaust tube heights may be adjusted in a manner similar to that of sleeve 40 and tube 50 by either raising or lowering them or by substituting tubes of varying lengths.

Reactant gases are permitted to interact in the presence of the substrate surface (or without a substrate in the case of powder synthesis) within the controlled environment of reactor chamber 10. Using the CVD reactor 10 of the present invention, it is possible to easily adjust various parameters both for experimentation and for production processing. For example, it may be desirable to provide a relatively long period of time in which the reactant gases can mix. In such a case, the reactor 10 would be set up with either or both of tube 50 and sleeve 40 close to the bottom of the reactor chamber 10. This is easily accomplished through the use of CVD reactor of the present invention. Alternatively, it may be desirable to reduce the time in which reactant gases are permitted to mix. This could be achieved by introducing the gases into the reactor chamber 10 at high flow rates and at an entry port relatively higher inside the chamber. This is accomplished by simply moving one or both of tube 50 and sleeve 40 to a higher position within reactor chamber 10 or by substituting a tube and/or sleeve of greater length.

Figure 2:
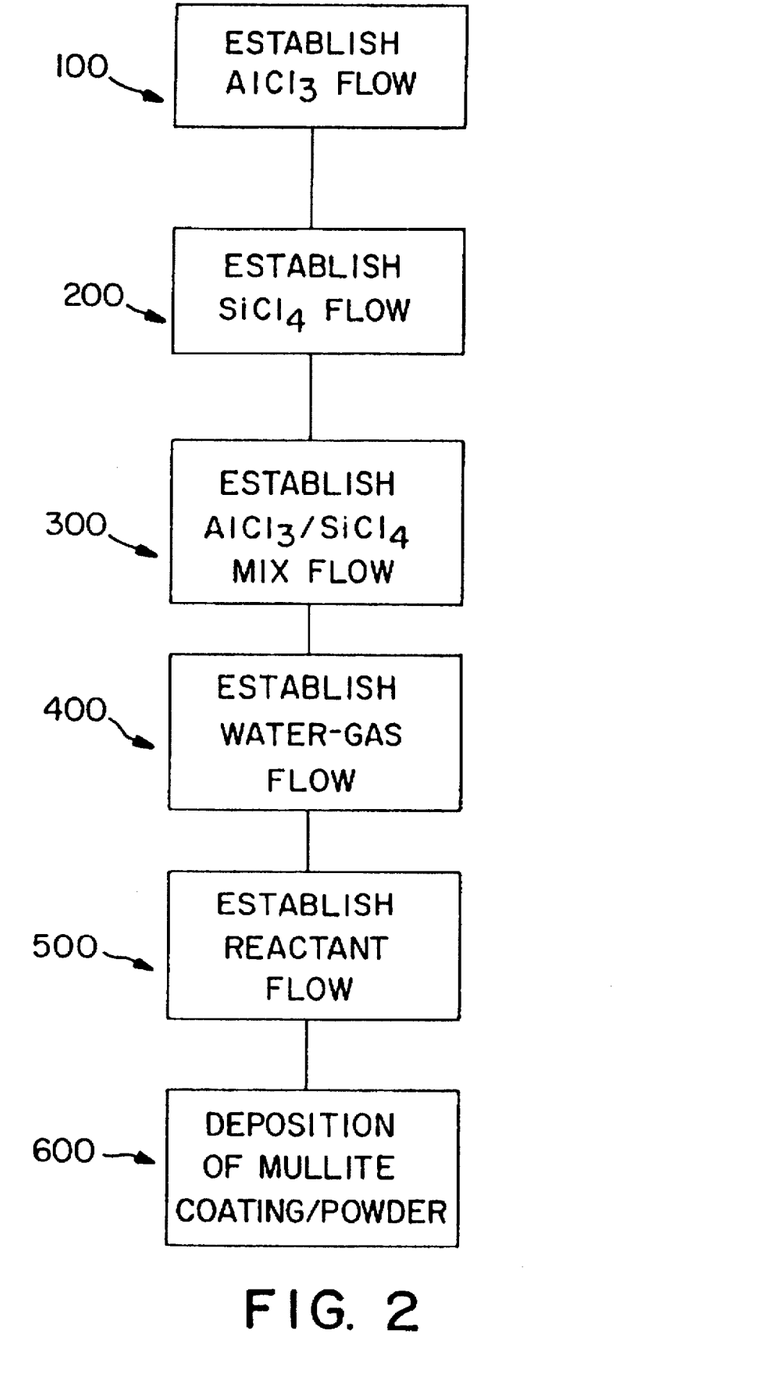
FIG. 2 is a flow chart illustrating a first embodiment of a method of the present invention for depositing a mullite coating.

An embodiment of a preferred method of the present invention will be explained with reference to FIG. 2. FIG. 2 depicts the steps of a method of the present invention in flow chart form. In step 100, a flow of $AlCl_3$ is established by flowing a Cl source over aluminum chips. In step 200, a flow of $SiCl_4$ is established by evaporation from a liquid source of $SiCl_4$ at room temperature. In step 300, a flow of $AlCl_3/SiCl_4$ is established by mixing the flow of $AlCl_3$ created in step 100 with the flow of $SiCl_4$ created in step 200. In step 400 a flow of water gas is established by combining $H_2$ and $CO_2$. In step 500 the water-gas flow and the $AlCl_3/SiCl_4$ flow are mixed to form a reactant flow. In step 600, the mixture of the water-gas flow, the $AlCl_3/SiCl_4$ flow, and the reactant flow causes the deposition of mullite in the form $3Al_2O_3.2SiO_2$. Each of these steps will now be more specifically explained.

In step 100, the flow of $AlCl_3$ is established. This step is accomplished in-situ by flowing a Cl source such as $Cl_2$ or HCl through aluminum chips maintained at a constant temperature. The Cl source is preferably combined with a carrier gas such Ar or $H_2$. It is possible, however, to employ any other inert gas as the carrier gas. The source $AlCl_3$ is derived from the following reaction:

This reaction is carried out at 300° C. in an Inconel 600 container. It is noted that the initial reaction, generating the $AlCl_3$ is accomplished outside of the CVD reactor prior to deposition. The gas is eventually introduced into reactor 10 through tube 50.

In step 200, $SiCl_4$ is obtained by evaporating a liquid source of $SiCl_4$ at room temperature. The flow rates of both the $Cl_2$ (used in step 100) and the $SiCl_4$ are carefully and accurately controlled by using mass flow controllers. In step 300, the $AlCl_3/SiCl_4$ mix flow is established by mixing the two gases prior to introducing them into the CVD reactor at the bottom of the reactor. This mixture is carried into the chamber with a carrier gas such as Ar. In one embodiment of the invention the mixture is introduced through tube 50.

Next, in step 400, the water-gas-shift is carried out by mixing $CO_2$ and $H_2$ prior to introduction into the reactor according to the following reaction:

This reaction causes water gas to form and then flow into the CVD reactor. The water-gas-shift reaction is preferably carried out at 950° C. and at 75 torr pressure and causes the formation of water gas within the reactor chamber.

In step 500, the reactant flow is established by further introducing the $AlCl_3/SiCl_4$ flow into the CVD reactor. The material to be coated is ultrasonically cleaned and then placed within the reactor on the sample holder 70 shown in FIG. 1. The sample holder 70 is preferably constructed from Inconel 600 alloy although it could be constructed from other substances that are chemically stable at the desired reaction temperature. It is also desirable for the sample holder 70 to be formed from a substance having a low creep rate.

Figure 3:
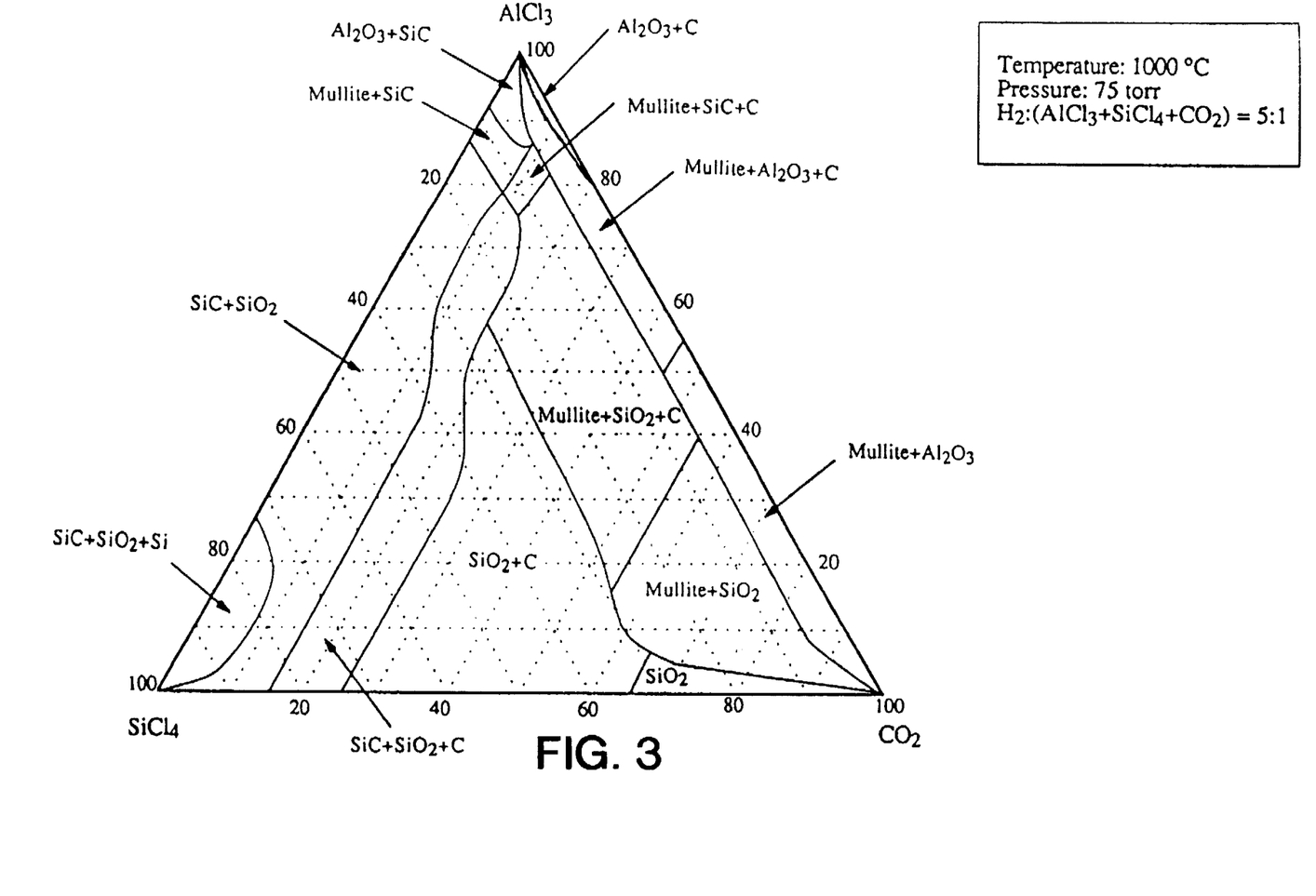
FIG. 3 is a CVD phase plot of the $AlCl_3$—$SiCl_4$—$CO_2$—$H_2$ system used in the present invention at 1000° C. and 75 torr.

The CVD reactor of FIG. 1 is preferably employed in housing the following reactions. The reactant flow is introduced at the bottom of the reactor and exits at the top of the reactor through the exhaust pipes that run to the bottom. In step 600, the deposition takes place in the CVD reactor according to the following reaction:

It should be noted that the CVD mullite coatings grown from $AlCl_3$—$SiCl_4$—$CO_2$—$H_2$ mixtures according to this invention are effectively grown as a result of desirable process parameters. Initial parameters for growth are determined as a result of an equilibrium thermodynamic analysis and the corresponding CVD phase diagrams that were constructed as a result of the analysis. FIG. 3 shows the CVD phase diagram constructed at 1000° C. and 75 torr. The diagram shows that individual phases or a combination of $Al_2O_3$, mullite, and $SiO_2$ phases can be obtained at relatively low concentrations of $AlCl_3$ and $SiCl_4$.

As one example of mullite coating deposition, the following process parameters are used:

a) Temperature: 950° C.
b) Pressure within Reactor: 75 Torr
c) Flow Rate ($H_2$): 2000 sccm
d) Flow Rate ($CO_2$): 300 sccm
e) Flow Rate ($AlCl_3$): 15 sccm
f) Flow Rate($SiCl_4$): 5 sccm In selecting the above parameters, the phase diagram of FIG. 3 is consulted and parameters are selected to maximize mullite formation by approximating the mullite+$SiO_2$/mullite+$Al_2O_3$ phase line. As such, it is suggested that the flow rate ratio between $AlCl_3$ and $SiCl_4$ is maintained at approximately 3:1. In this way, carbon deposits are minimized within the system.

The processes described herein could be used with a multitude of process parameter combinations and the above example is merely exemplary and not limiting. The flow rate of $AlCl_3$ is preferably in the range from 10–20 sccm and the flow rate of $SiCl_4$ is preferably in the range between 3 and 7 sccm. These values are not limiting, however, in that the inventors have not confirmed either the effectiveness or non-effectiveness of all possible parameter sets.

Figure 4A:
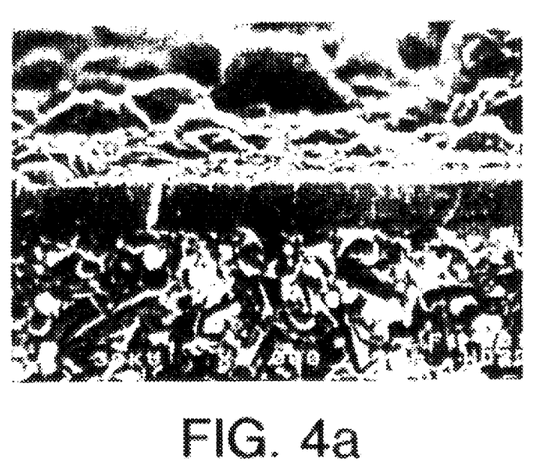
Figure 4B:
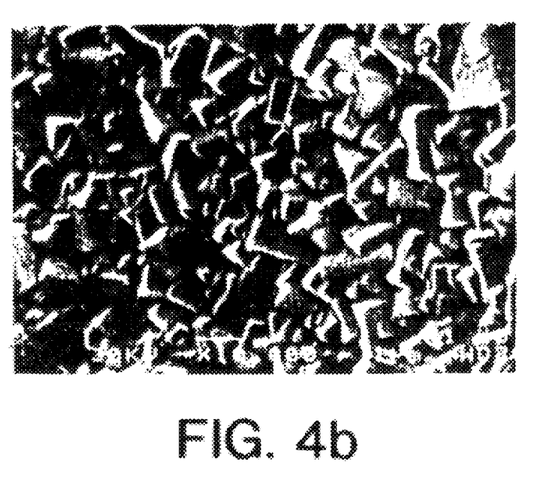
Figure 5:
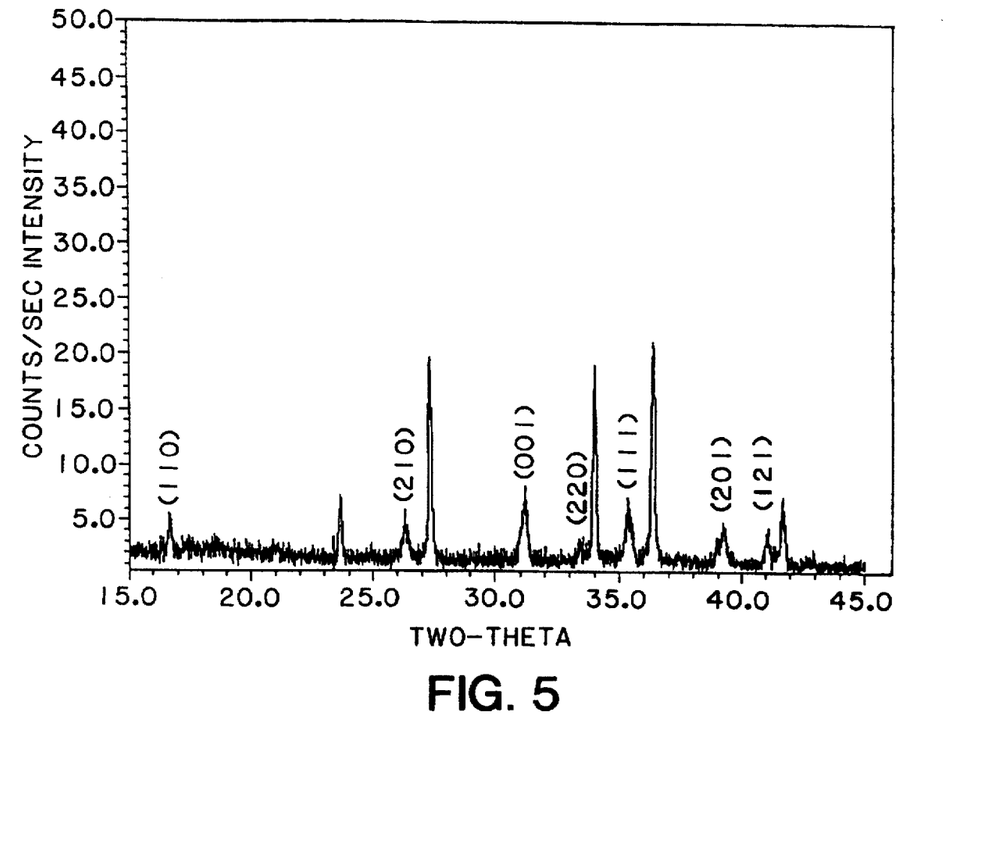
FIG. 5 is a graph showing the x-ray diffraction pattern for a mullite coating on $Si_3N_4$ as grown according to one embodiment of this invention.

FIG. 4 is a scanning electron micrograph of a typical mullite coating on a $Si_3N_4$ substrate using the above process parameters. X-ray diffraction analysis confirms that mullite is the only crystalline phase present in the coating. FIG. 5 shows the x-ray diffraction pattern. The coating is uniform, with a fine grained, equiaxed structure. There is some agglomeration of grains seen on the surface. This, however is not believed to have originated from the substrate surface, but instead is believed to be formed on the surface of the coating. The coating appears to be very dense. Additionally, no cracks are observed on the surface of the coating. Although the example above and the photomicrographs involve the coating of an $Si_3N_4$ substrate, it is to be understood that the method of this invention as well as the CVD reactor of this invention are equally well applied to SiC, other homogeneous substrates such as WC, WC-Co, $Al_2O_3$, $SiO_2$, mullite, BN, AlN, $ZrO_2$ and composite substrates based upon SiC and $Si_3N_4$.

In another embodiment of the present invention, CVD mullite powder is synthesized from $AlCl_3$—$SiCl_4$—$CO_2$—$H_2$ mixtures. Again, the parameters for synthesis are selected based upon the equilibrium thermodynamic analysis and the corresponding CVD phase diagram of FIG. 3 constructed as a result of that analysis. The process steps for accomplishing the synthesis are the same as those described above with respect to the deposition of mullite coatings. The reaction is preferably performed in the reactor of FIG. 1. Again, there should be provided accurate temperature, pressure and flow controls.

In this second embodiment of the present invention, the process described above is employed in order to create a mullite powder. Parameters are selected based upon the equilibrium thermodynamic analysis and the corresponding CVD phase diagram (FIG. 3) discussed above. When there is no surface available for the mullite to nucleate upon, under the proper process parameters (e.g. sufficient energy and proper gas flow ratios), a mullite powder may be formed through homogeneous nucleation. This physical property forms the basis for the synthesis of mullite powder according to the second embodiment of the present invention. In order to synthesize the powder, the reactor of FIG. 1 is employed and an identical process as that described above is used. The process parameters, however, are different and there is no substrate placed in the CVD reactor. In the case of powder synthesis, the powder will form upon the sidewalls of the CVD reactor chamber.

As one example of powder synthesis, the following process parameters are used:

a) Temperature: 950° C.

b) Pressure within Reactor: 75 Torr c) Flow Rate ($H_2$): 2000 sccm d) Flow Rate ($CO_2$): 300 sccm e) Flow Rate ($AlCl_3$): 30 sccm f) Flow Rate($SiCl_4$): 10 sccm In general, the process favors the production of mullite powder through homogenous nucleation at high reactant flow rates and minimal interaction time. Conversely, coating is preferably accomplished at low reactant flow rates and longer interaction times. It is further believed that a higher reaction temperature would favor the creation of mullite powder.

Figure 6A:
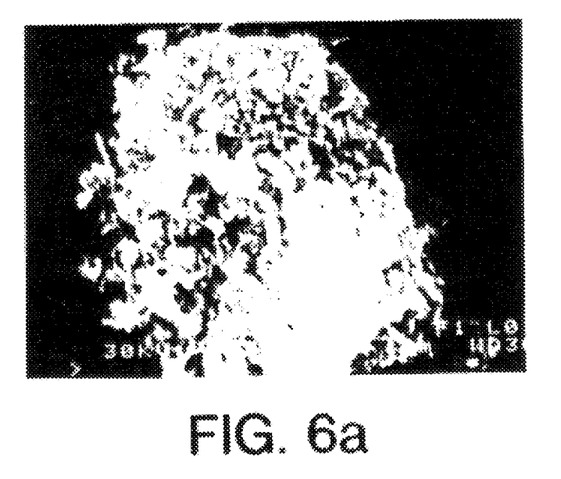
FIG. 6(a) and 6(b) scanning electron micrograph of mullite powder formed according to another embodiment of the method of this invention.
Figure 6B:
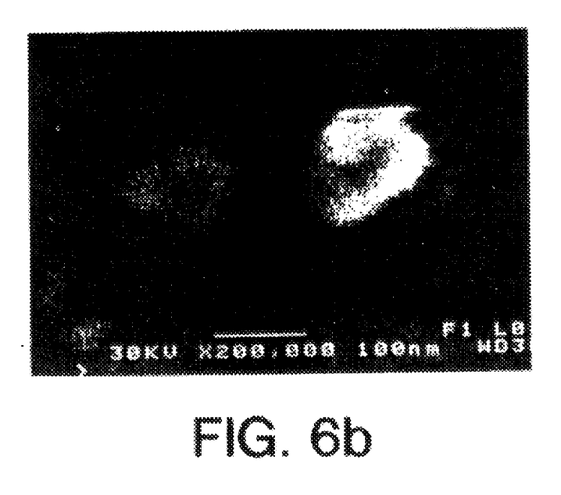
Figure 7:
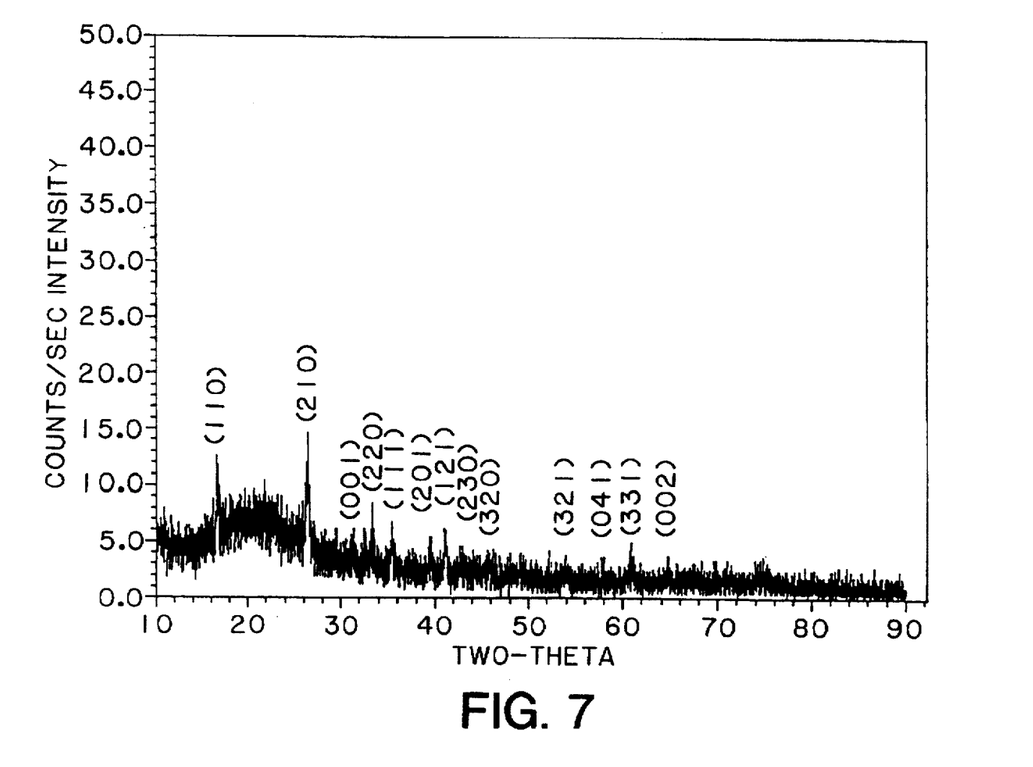
FIG. 7 is a graph showing the x-ray diffraction pattern for mullite powder as grown according to one embodiment of this invention.

The process parameters listed above have yielded particles of approximately 100nm. FIG. 6 shows scanning electron micrographs of mullite powder observed in the CVD reactor as a result of the above-described process. The only crystalline phase found in the powder was mullite. This is confirmed the x-ray diffraction pattern illustrated in FIG. 7. The structure and composition of the powder grown according to the process of the present invention may be accurately controlled through changes in process parameters and deposition conditions. For example, it is postulated that an increased temperature will result in a larger particle size.

It is to be understood that although the present invention has been described with particularity, numerous other arrangements may be devised by one skilled in the art without departing from the scope or spirit of this invention. The invention is thus limited only by the accompanying claims.

We claim:

1. A method for depositing crystalline CVD mullite coatings on a substrate comprising the steps of:

a) placing the substrate in an enclosed chamber;

b) establishing a flow of Al source gas;

c) establishing a flow of Si source gas;

d) mixing the Al source gas with the Si source gas;

e) establishing a flow of one or more oxidizing gases;

f) transporting the Al/Si source gas mix and the oxidizing gas into said enclosed chamber;

g) establishing a reactant flow by combining the Al/Si source gas mix and the oxidizing gas; and h) depositing a crystalline layer of mullite from the reactant flow on to the substrate to be coated.

2. The method of claim 1 wherein said enclosed chamber is maintained at a constant temperature in the range from about 800 degrees celsius to about 1500 degrees celsius.

3. The method of claim 1 wherein said enclosed chamber is maintained at a constant pressure in the range from about 0.2 torr to about 760 torr.

4. The method of claim 1 wherein the substrate is a silicon based ceramic.

5. The method of claim 1 wherein the substrate material is selected from the group consisting of Si, SiC, $Si_3N_4$, WC, WC-Co, $Al_2O_3$, $SiO_2$, mullite, BN, AlN and $ZrO_2$.

6. The method of claim 1 wherein the substrate material is a composite substrate based upon SiC.

7. The method of claim 1 wherein the substrate material is a composite substrate based upon $Si_3N_4$.

8. The method of claim 1 wherein the Al source gas is a halide of Al.

9. The method of claim 1 wherein the Si source gas is a halide of Si.

10. The method of claim 8 wherein the Al source gas is $AlCl_3$.

11. The method of claim 9 wherein the Si source gas is $SiCl_4$.

12. The method of claim 1 wherein the oxidizing gas is a mixture of $H_2$ and $CO_2$.

13. The method of claim 1 wherein the Al/Si gas mix is transported into the enclosed chamber with a carrier gas.

14. The method of claim 1 wherein the oxidizing gas is transported into the enclosed chamber with a carrier gas.

15. The method of claim 1 wherein Al/Si ratio is maintained at approximately 3 to 1.

* * * * *